United States Patent
Hemmi et al.

(10) Patent No.: US 6,650,547 B2
(45) Date of Patent: Nov. 18, 2003

(54) ROTARY STRUCTURE FOR RELAYING SIGNALS

(75) Inventors: Yoshinobu Hemmi, Takatsuki (JP); Tsuyoshi Uchida, Kawasaki (JP); Satoshi Takamori, Otsu (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 10/371,162

(22) Filed: Feb. 20, 2003

(65) Prior Publication Data

US 2003/0179555 A1 Sep. 25, 2003

(30) Foreign Application Priority Data

Feb. 25, 2002 (JP) .......................... 2002-048063

(51) Int. Cl.7 .............................. H05K 5/04; H05K 5/06
(52) U.S. Cl. ......................... 361/755; 361/752; 361/797; 361/730; 248/917; 248/919; 439/165; 439/164; 439/31
(58) Field of Search .................. 361/755, 752, 361/724, 714, 816, 797, 796, 800, 730, 826, 827; 257/99; 455/347; 439/92, 95, 165, 31, 164, 157; 248/917, 919

(56) References Cited

U.S. PATENT DOCUMENTS 5,681,176 A * 10/1997 Ibaraki et al. ............... 439/165
6,275,376 B1 * 8/2001 Moon .......................... 361/683
6,439,905 B2 * 8/2002 Andrews et al. ............ 439/165
6,466,278 B1 * 10/2002 Harrison et al. ............ 348/836

FOREIGN PATENT DOCUMENTS

JP          165144       * 6/2001

* cited by examiner

Primary Examiner—David Martin
Assistant Examiner—Hung Bui
(74) Attorney, Agent, or Firm—Rosenthal & Osha L.L.P.

(57) ABSTRACT

The present invention provides a space-saving rotary structure for relaying signals which can relay a large number of signal lines without causing a disconnection of the signal lines. The rotary structure for relaying signals comprising a fixed frame which is supported and fixed in the inside of first and second casings, a rotary sleeve which is rotatably inserted into a through hole of the fixed frame and has a distal end thereof projected to the outside of the first and the second casing, a rotary frame which is arranged outside the first and second casings and is fixed to the distal end of the rotary sleeve such that the rotary frame is integrally rotatable with the rotary sleeve, and a flexible printed wiring film which has a distal end thereof pulled out to the outside of the first and second casings along the rotary sleeve and is wound around a winding tongue of the rotary sleeve which is positioned in the inside of the first and the second casings.

8 Claims, 9 Drawing Sheets

ROTARY STRUCTURE FOR RELAYING SIGNALS

BACKGROUND OF THE INVENTION

1. Field of the Invention

The present invention relates to a rotary structure for relaying signals, for example, a rotary structure for relaying signals which can be rotated such that a display module of a portable cellular phone can be twisted.

2. Description of the Related Art

Conventionally, as a portable cellular phone, there has been known a portable cellular phone which supports a display module on a manipulation module using a hinge by way of a support body such that the display module can be opened and closed. Particularly, when the portable cellular phone requires a large number of signal lines, to miniaturize the device and to prevent the fatigue disconnection of the signal lines attributed to the repeated operations of the display module, the manipulation module and the display module are electrically connected by way of a flexible printed wiring film for relaying signals.

However, with respect to the above-mentioned portable cellular phone, it is impossible to rotate the opened display module in a twisting manner so that the manipulation method is limited whereby the portable cellular phone exhibits poor availability. To cope with this situation, it may be possible to use a large number of harnesses in bundle to manipulate the above-mentioned display module in a twisted form. However, when it is necessary to transmit a large volume of information, the number of harnesses is increased and hence, the twisting manipulation becomes difficult, the miniaturization of the device becomes difficult, and the disconnection is liable to occur. Accordingly, the use of the flexible printed wiring film has been considered. However, when the twisting action is applied to the film, a complicated inner stress is generated in the inside of the printed wiring film thus arising a problem that the printed wiring is liable to be peeled off and disconnected.

The present invention has been made in view of the above-mentioned drawbacks and it is an object of the present invention to provide a rotary structure for relaying signals which can relay signals without disconnecting a large number of signal lines and can save a space.

SUMMARY OF THE INVENTION

To achieve the above-mentioned object, a rotary structure for relaying signals according to the present invention comprises a fixed frame which is supported and fixed in the inside of a casing, a rotary shaft which is rotatably inserted into a through hole of the fixed frame and has a distal end thereof projected to the outside of the casing, a rotary frame which is disposed outside the casing and is fixed to the distal end of the rotary shaft such that the rotary frame is integrally rotatable with the rotary shaft, and a flexible printed wiring film which has a distal end thereof pulled out to the outside of the casing along the rotary shaft and wound around a winding tongue of the rotary shaft which is positioned in the inside of the casing.

Due to such a constitution, according to the present invention, when the rotary frame is rotated, the rotary shaft is rotated so as to neatly wind the printed wiring film. Accordingly, even when the rotary frame is repeatedly rotated, a complicated inner stress is not generated in the inside of the printed wiring film and hence, there is no possibility that the printed wiring is peeled off or is disconnected.

Further, by printing a large number of signal lines to the printed wiring film, it is possible to obtain the miniaturized device which can transmit a large volume of signals.

According to an embodiment of the present invention, a holding member which includes a winding tongue and constitutes a part separate from the rotary shaft may be assembled to one end of the inside of the casing of the rotary shaft.

According this embodiment, since the printed wiring film can be wound around the holding member which constitutes a part separate from the rotary shaft, the degree of freedom in designing can be expanded.

According to another embodiment of the present invention, on at least one side of the fixed frame, a position restricting portion which is engaged with a winding portion of the printed wiring film is mounted so as to prevent the printed wiring film from being entangled.

According to this embodiment, the printed wiring film can be smoothly wound or released thus further enhancing the durability of the printed wiring film.

As another embodiment of the present invention, rotation restricting means which restricts a rotational movement of the rotary frame is mounted on the fixed frame.

According to this embodiment, the rupture of the printed wiring film attributed to the excessive rotation of the rotary frame can be prevented.

As another embodiment of the present invention, a resilient ring which ensures a so-called click feeling is arranged between the fixed frame and the rotary frame.

According to this embodiment, a manipulation feeling is enhanced so that the availability is enhanced.

As another embodiment of the printed wiring film according to the present invention, on at least one end of a straight winding portion of the printed wiring film, an extension portion which extends in the direction orthogonal to an axis of the winding portion may be formed.

To be more specific, on one end of a straight winding portion of the printed wiring film, a first extension portion which extends in the direction orthogonal to an axis of the winding portion is formed, and on the other end of the winding portion, a second extension portion which is arranged orthogonal to an axis of the winding portion and extends in the direction opposite to the first extension portion may be formed.

According to this embodiment, since the winding portion and the extension portions are separated by arranging them to become orthogonal to each other, a complicated inner stress is not generated in the printed wiring film so that the printed wiring is hardly peeled off or disconnected.

Particularly, the second extension portion of the printed wiring film may have a bent planar shape.

According to this embodiment, when the second extension portion is wound, portions thereof are not overlapped to each other and hence, it is possible to obtain an advantageous effect that the second extension portion can be easily pulled out.

PREFERRED EMBODIMENTS OF THE PRESENT INVENTION

An embodiment according to the present invention is explained in conjunction with attached drawings consisting of FIG. 1 to FIG. 9.

This embodiment is directed to a case in which a rotary structure for relaying signals is applied to a portable cellular phone, wherein a manipulation module 1 and a display module 2 are rotatably mounted about two axes $9a$, $9b$ which are orthogonal to each other by way of a support body 10.

Figure 1:
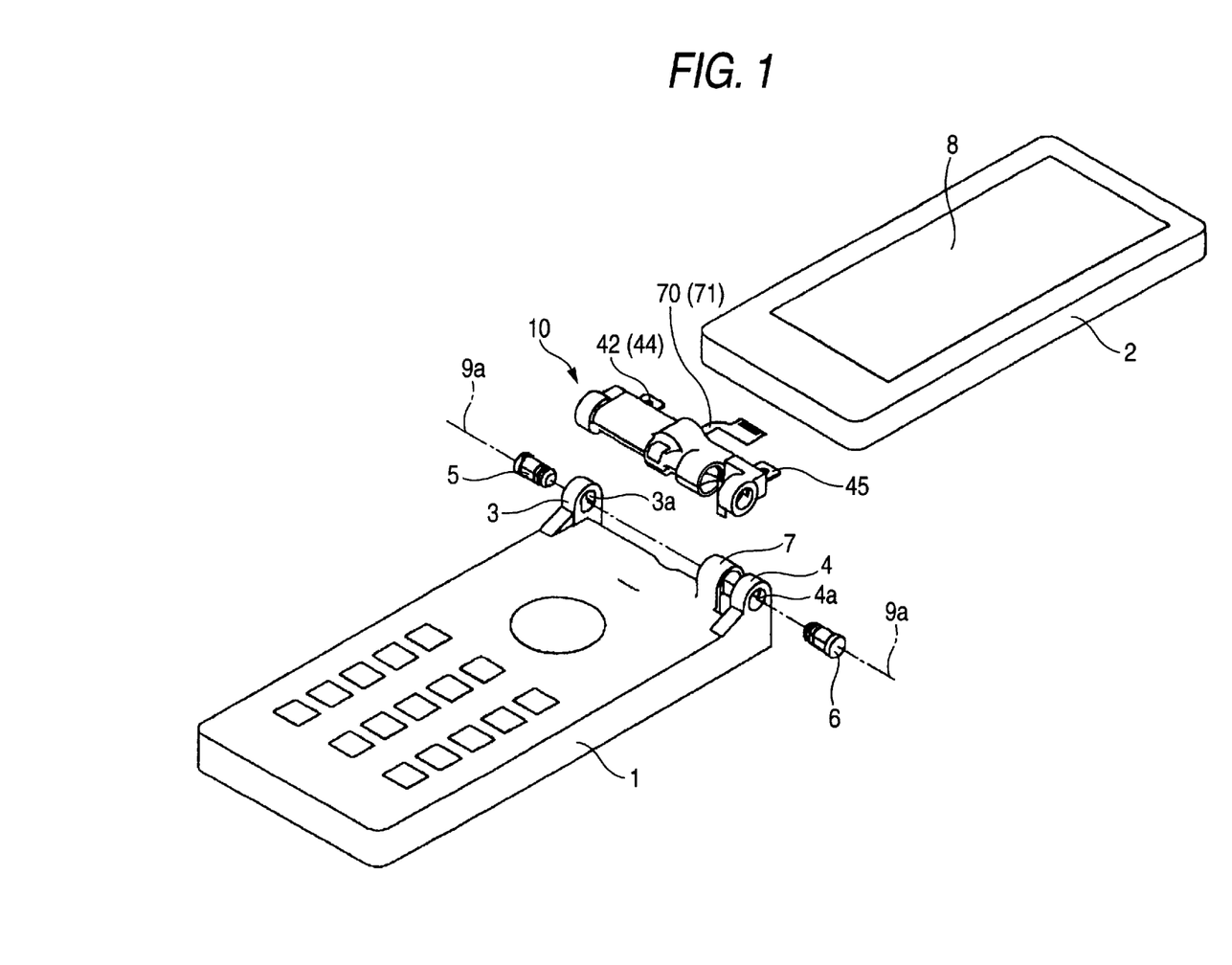
FIG. 1 is an exploded perspective view showing an embodiment in which a rotary structure for relaying signals according to the present invention is applied to a portable cellular phone.

With respect to the manipulation module 1, as shown in FIG. 1, a pair of ribs 3, 4 which are served for mounting the display module 2 are fixed to both ends of a peripheral portion of one surface thereof in a protruding manner. Particularly, in the vicinity of an inner side of the rib 4, a concealing portion 7 having an approximately U shaped cross section is integrally formed with one surface of the manipulation module 1.

As shown in FIG. 1, a liquid crystal panel 8 which is connected to a large number of signal lines is mounted on one surface of the display module 2. The display module 2 is fixed to arm portions 44, 45 of a rotary frame 42 which constitutes a support body 10 explained later by using screws.

Figure 4:
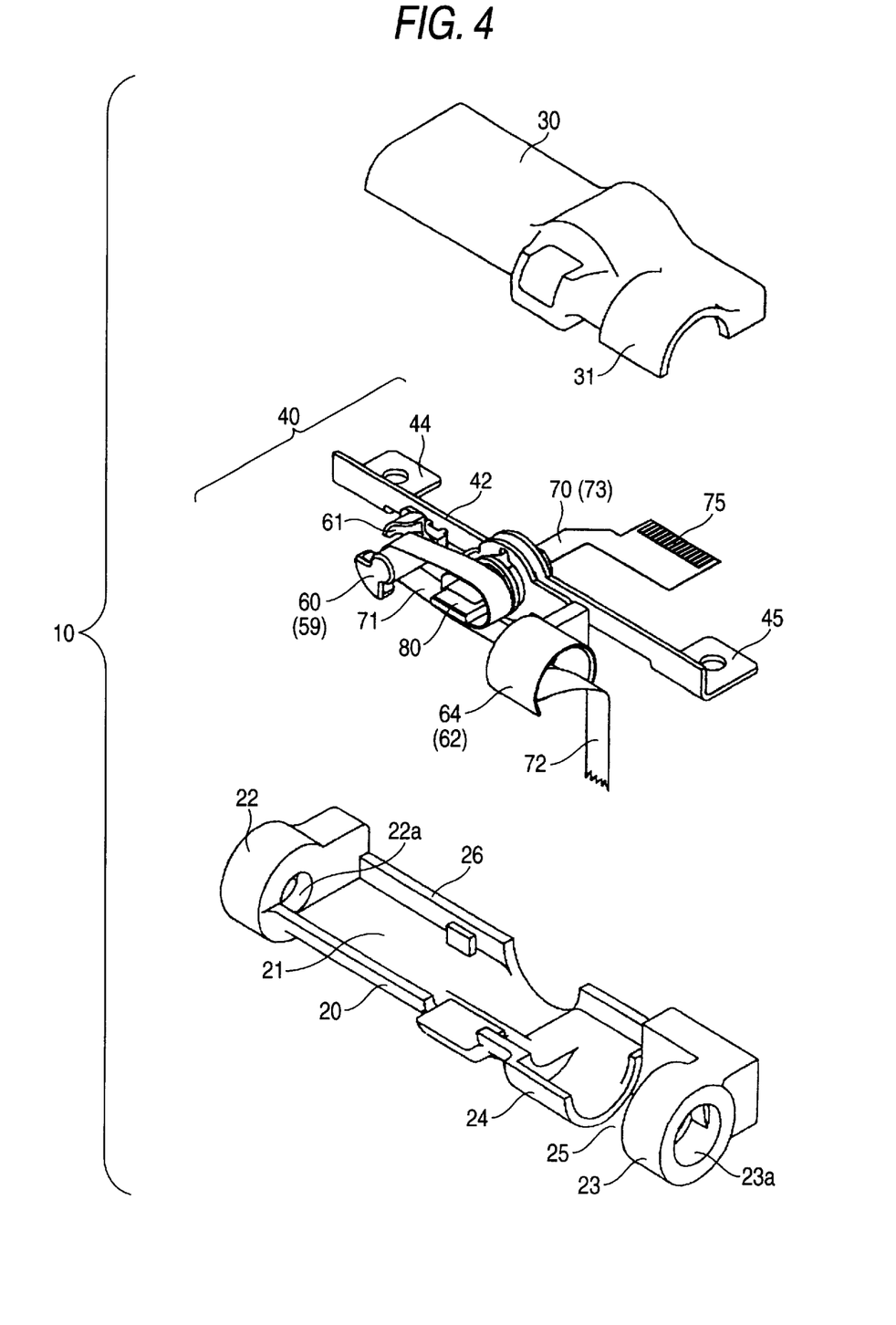
FIG. 4 is an exploded perspective view of a support body according to the embodiment of the present invention.

The support body 10 is, as shown in FIG. 4, comprised of an inner driving mechanism 40 which is sandwiched between a first casing 20 and a second casing 30.

As shown in FIG. 4, the first casing 20 includes a recessed portion 21 which can house the inner driving mechanism 40 on an upper surface thereof and ribs 22, 23 are respectively mounted on both ends of the first casing 20. Further, a bulging portion 24 having an approximately semicircular cross section is formed in the vicinity of the rib 23 and, at the same time, a recessed portion 25 is formed between the rib 23 and the bulging portion 24.

As shown in FIG. 4, the second casing 30 has a planar shape which can cover the first casing 20 on which the inner driving mechanism 40 is mounted. Particularly, a bulging portion 31 which is configured to assume a line symmetry with the bulging portion 24 of the first casing 20 and abuts the bulging portion 24 is integrally formed with the second casing 30.

Figure 6:
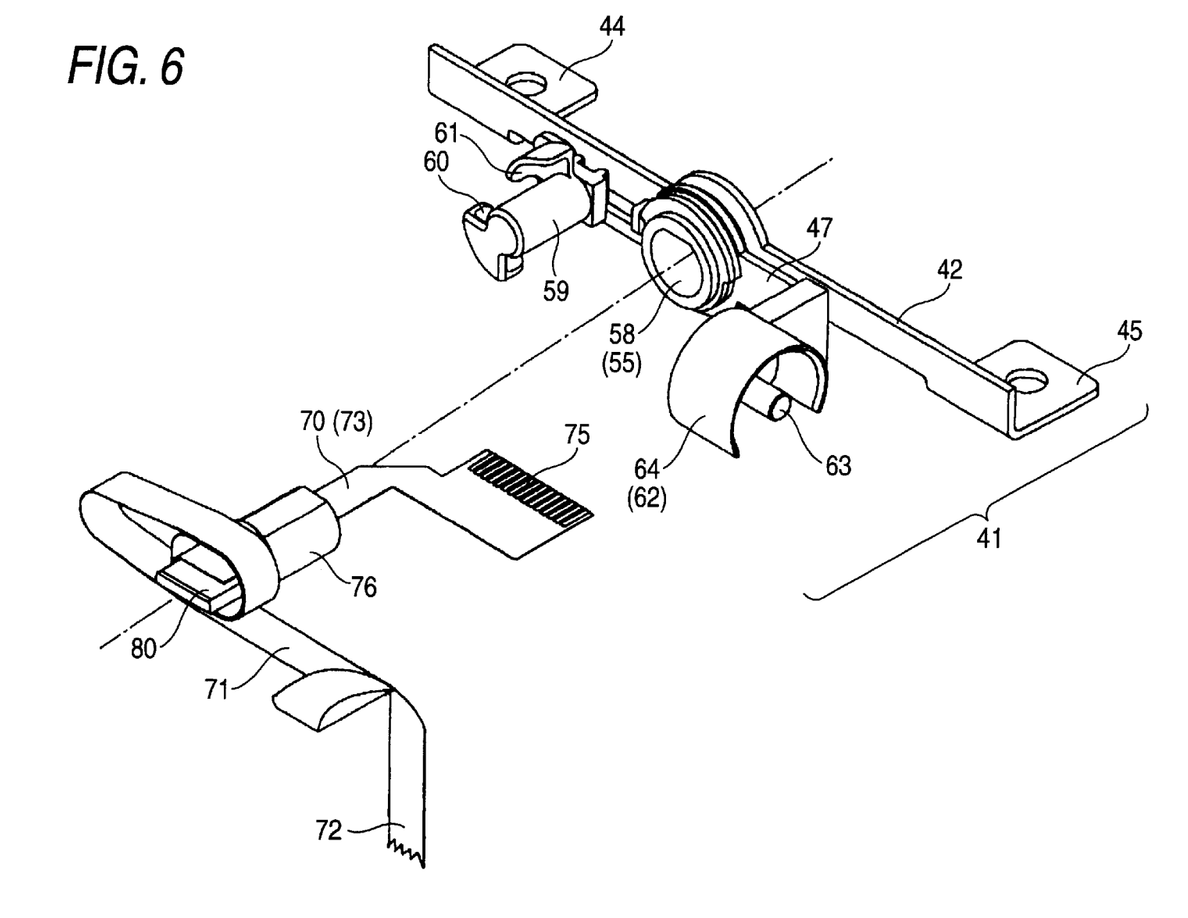
FIG. 6 is an exploded perspective view of an inner driving mechanism which constitutes a support body.
Figure 7:
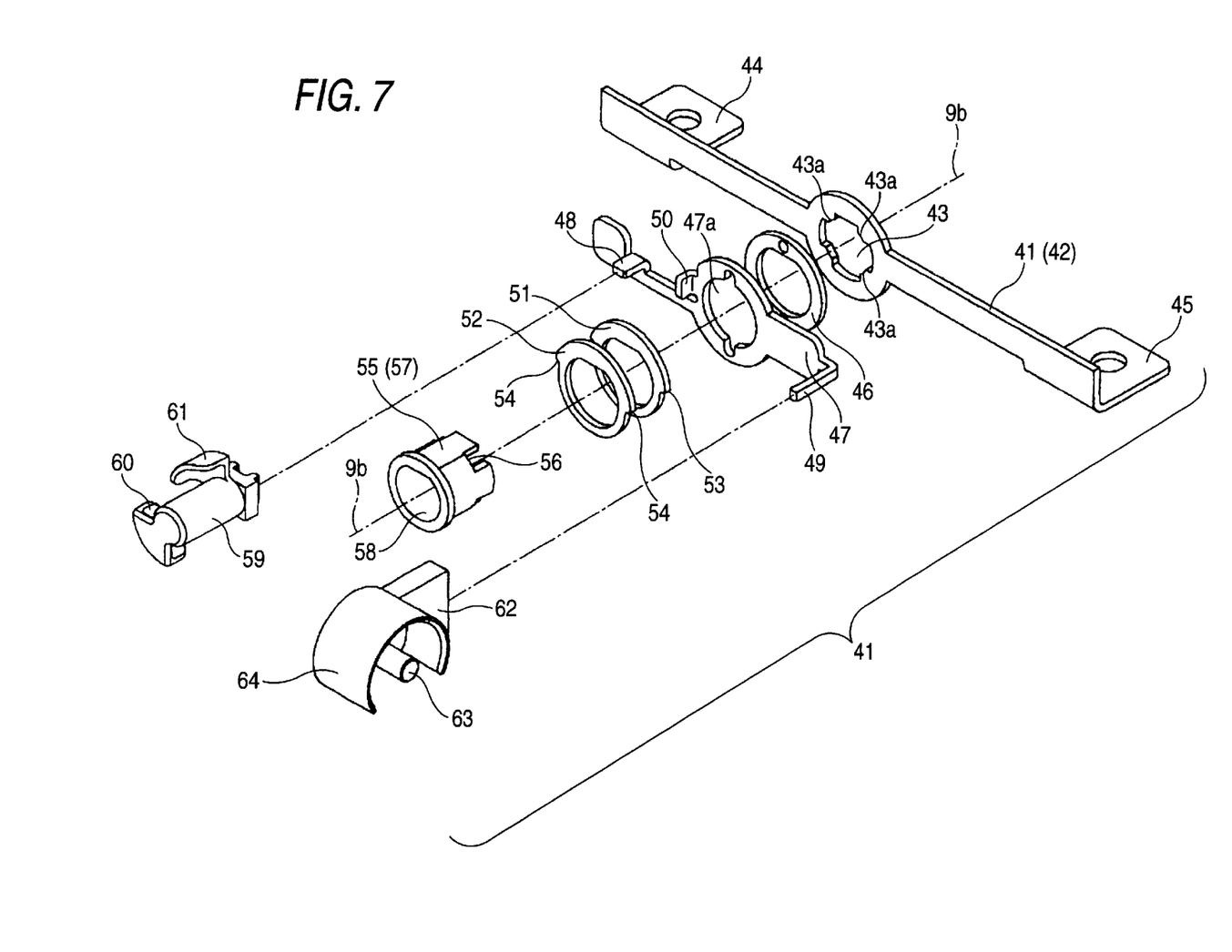
FIG. 7 is a exploded perspective view of a driving unit which constitutes the inner driving mechanism.

As shown in FIG. 6 and FIG. 7, the inner driving mechanism 40 is constituted such that a flexible printed wiring film 70 is assembled to a driving unit 41 which performs a rotary movement.

That is, the driving unit 41 is constituted of a rotary sleeve 55 which passes through a through hole 43 of the rotary frame 42 and is fixed to the rotary frame 42 by caulking, wherein the rotary sleeve 55 is integrally assembled with a resilient ring 46, a fixed frame 47 and two rotation prevention rings 51, 52.

The rotary frame 42 includes the mounting arm portions 44, 45 which are formed by bending both ends thereof in an erected manner.

The display module 2 is fixed to the arm portions 44, 45 by the screws.

The resilient ring 46 is provided for ensuring a necessary click feeling when the display unit 2 is rotated by twisting and to eliminate a play of the display module 2 with respect to the manipulation module 1.

Positioning protrusions 48, 49 are respectively erected from both sides of the fixed frame 47 by cutting. Position restricting members 59, 62 described later are respectively fitted on the positioning projections 48, 49 by pushing. Further, an engaging pawl 50 for stopping rotation is formed in the vicinity of the through hole $47a$ of the fixed frame 42 by bending in an erected manner.

A pair of position restricting stepped portions 53, 54 are respectively formed on outer peripheral faces of two rotation stopper rings 51, 52 for restricting the rotary operation of the rotary frame 42 within a given angle. Here, it is not always necessary to use two rotation stopper rings 51, 52 and only one rotation stopper ring may be used. The reason why two rings are used is that press forming can be easily performed.

The rotary sleeve 55 is fixed to the rotary frame 42 by caulking after engaging a notched portion 56 formed in a distal peripheral portion with a protrusion $43a$ which is formed on the through hole 43 of the rotary frame 42. Accordingly, the rotary sleeve 55 is integrally rotated with the rotary frame 42. Further, a planar face 57 which is formed on an outer peripheral surface of the rotary sleeve 55 is engaged with inner peripheral faces of engaging holes of the resilient ring 46 and two rotation stopper rings 51, 52. Due to such a constitution, when the rotary frame 42 is rotated, the resilient ring 46, the rotation stopper rings 51, 52 and the rotary sleeve 57 are integrally rotated.

The position restricting member 59 is provided for restricting the position of the rotary frame 42 such that the printed wiring film 70 is not removed or the printed wiring film 70 is not entangled when the rotary frame 42 is twisted about the rotary axis $9b$. Accordingly, as shown in FIG. 7, two engaging pawls 60, 61 are integrally formed with the position restricting member 59 by angularly displacing them by approximately 90 degrees.

The position restricting member 62 is provided for restricting the position of the rotary frame 42 such that the printed wiring film 70 is not excessively twisted or entangled when the rotary frame 42 is rotated about the rotary axis $9a$. Accordingly, as shown in FIG. 7, a cover 64 having an approximately semicircular cross section is integrally and concentrically formed with the position restricting member 62 about a support shaft 63 which projects in the sideward direction.

Figure 8A:
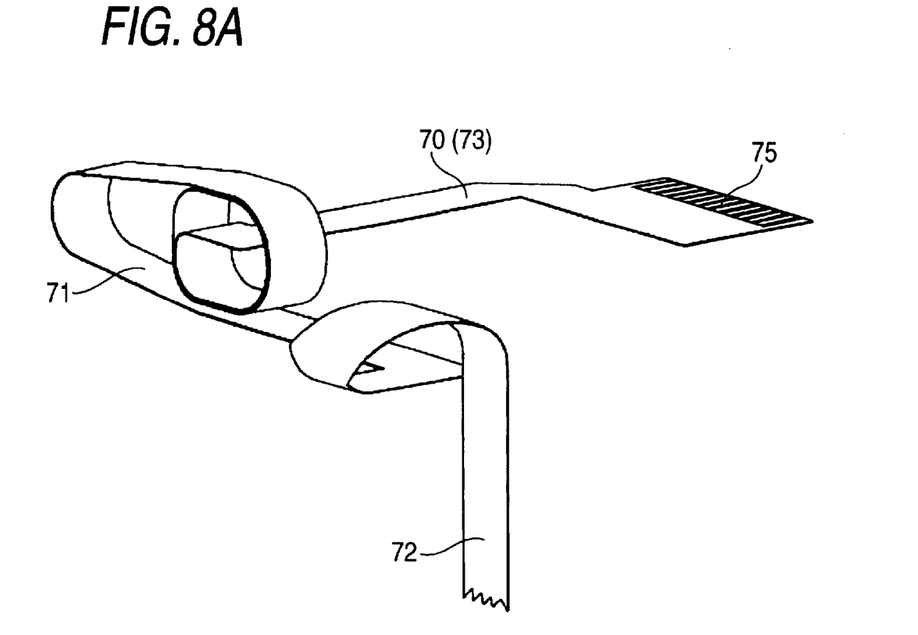
FIG. 8A is a perspective view showing a printed wiring film of the inner driving mechanism and FIG. 8B is an exploded perspective view showing a holding member of the inner driving mechanism.
Figure 9:
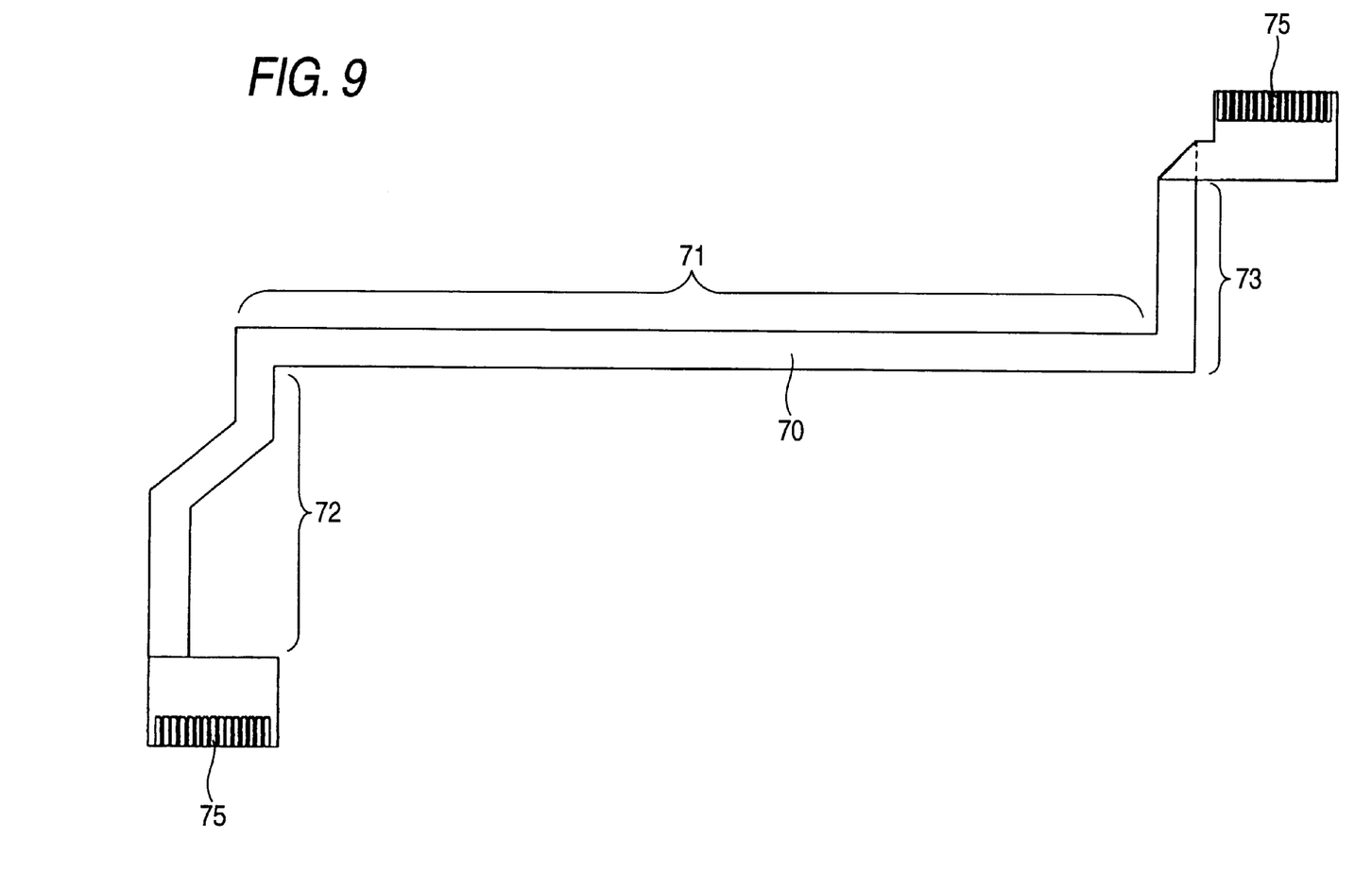
FIG. 9 is a plan view of a printed wiring film shown in FIG. 8.

As shown in FIG. 8A and FIG. 9, the printed wiring film 70 includes an elongated straight winding portion 71 and extension portions 72, 73 which are arranged orthogonal to an axis of the winding portion 71 and respectively extend in opposed directions from both ends of the winding portion 71. Connection terminals 74, 75 are printed on both of distal end portions of the extension portions 72, 73. Particularly, the extension portion 72 has a bent planar shape and hence, the extension portion 72 is displaced without being overlapped when the extension portion 72 is wound in a ring shape as shown in FIG. 8A.

Figure 8B:
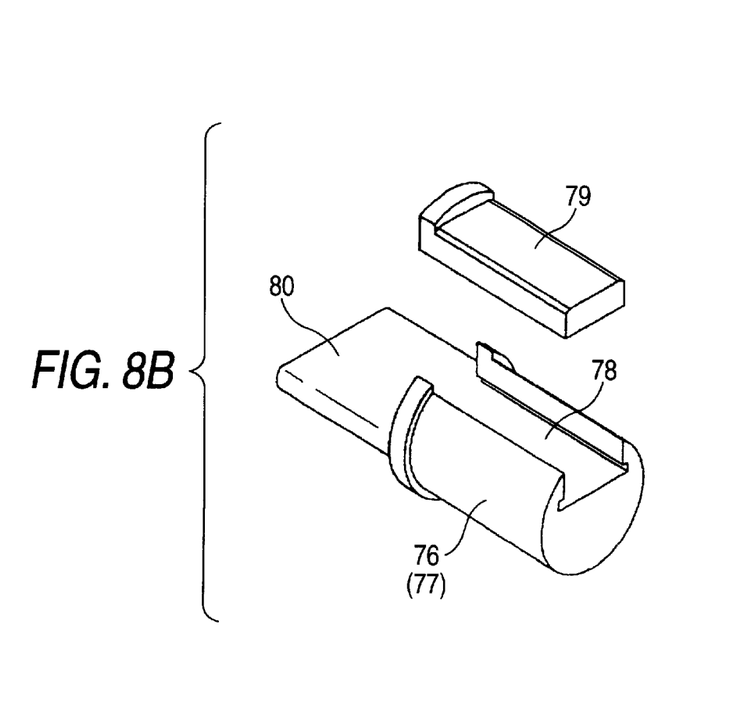

As shown in FIG. 8B, the holding member 76 is provided for winding the printed wiring film 70 while holding the film 70.

That is, the holding member 76 includes an insertion portion 77 having a cross section which allows the insertion portion 77 to be inserted into an insertion hole 58 of the rotary sleeve 55 and a fitting portion 79 which is fitted into a positioning groove 78 formed in the insertion portion 77 and is integrally formed with the insertion portion 77, wherein a winding tongue 80 is extended in the sideward direction from an end face of the insertion portion 77.

After positioning the extension portion 73 of the printed wiring film 70 at the positioning groove 78 of the insertion portion 77, the fitting portion 79 is fitted into and integrally formed with the insertion portion 77. Then, a connection terminal 75 of the printed wiring film 70 is inserted into the insertion hole 58 of the rotary sleeve 55 and is made to pass therethrough. Further, the insertion portion 77 of the holding member 76 is inserted into and fitted into the insertion hole 58. Subsequently, the winding portion 71 of the printed wiring film 70 extends over the position restricting member 59 and the extension portion 72 is wound around the support shaft 63 of the position restricting member 62.

A surface of the fitting portion 79 which forms the holding member 76 constitutes a planar face. The fitting portion 79 is inserted and engaged with the insertion hole 58 of the rotary sleeve 55. Due to such a constitution, when the rotary frame 42 is rotated, the rotary sleeve 55 and the holding member 76 are integrally rotated, and the winding tongue 80 winds or releases the winding portion 71 of the printed wiring film 70.

In this embodiment, even when the rotary frame 42 is rotated, the rotary frame 42 always functions so as to wind the printed wiring film 70 and does not function to twist the printed wiring film 70. Accordingly, this gives rise to an advantage that the printed wiring is neither peeled off nor disconnected due to the twisting action.

Figure 5A:
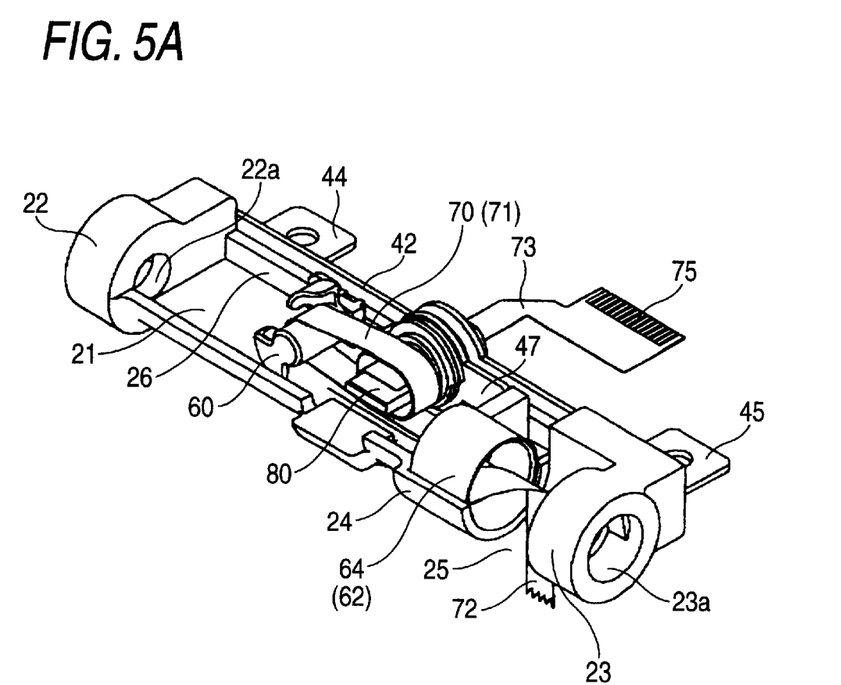
FIG. 5A is a partial exploded perspective view of the support body shown in FIG. 4
Figure 5B:
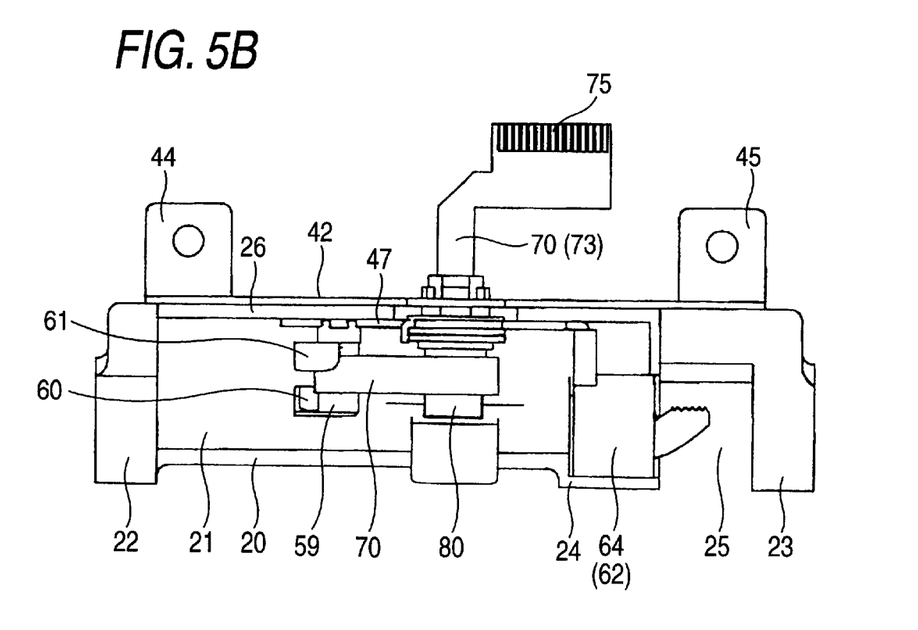
FIG. 5B is a partial exploded plan view of the support body shown in FIG. 4.

Here, the inner driving mechanism 40 which is constituted of the above-mentioned inner constitutional components is, as shown in FIG. 5A, and FIG. 5B, fitted into and positioned in the recessed portion 21 of the first casing 20 and, at the same time, the peripheral portion 26 of the first casing 21 is sandwiched by the rotary frame 42 and the fixed frame 47.

Subsequently, the manner of using the portable cellular phone according to this embodiment is explained.

As shown in FIG. 1, the support body 10 is rotatably mounted on the manipulation module 1 about the rotary axis 9a by way of the ribs 3, 4 formed on the manipulation module 1 and support pins 5, 6 which are respectively inserted into the support holes 3a, 4a.

Figure 2A:
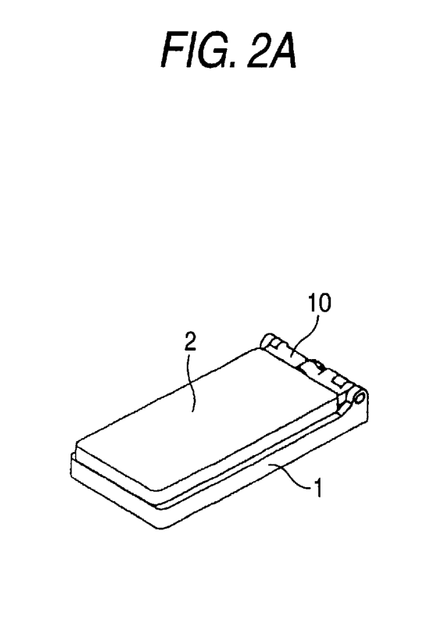
FIG. 2 is a perspective view for explaining the manner of using a portable cellular phone of the embodiment shown in FIG. 1.
Figure 2B:
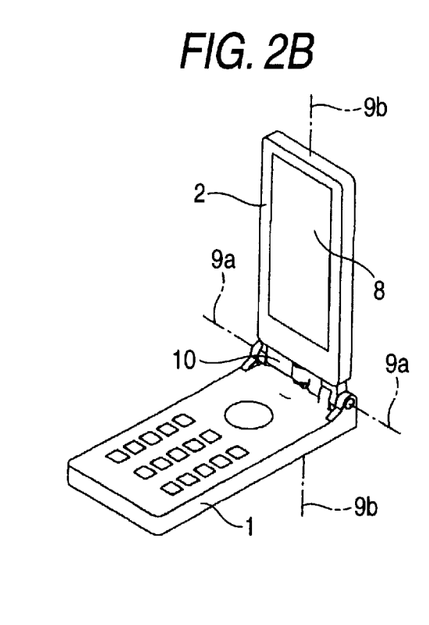
Figure 2C:
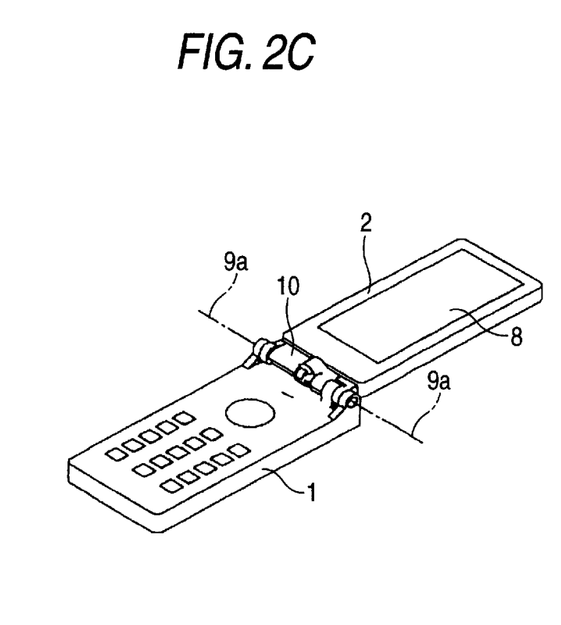

Accordingly, as shown in FIG. 2, when the display module 2 which is fixed to the rotary frame 42 by screws is rotated about the axis 9a and is opened, the extension portion 72 of the printed wiring film 70 positioned in the inside of the cover 64 is slackened. Then, the extension portion 72 expands within the cover 64 and absorbs the displacement of the display module 2.

Further, as shown in FIG. 3, the display module 2 is rotatably mounted on the support body 10 about the rotary axis 9b. Accordingly, when the display module 2 is rotated about the rotary axis 9b, the rotary sleeve 55 which is engaged with the display module 2 is also integrally rotated. As a result, the resilient ring 46, the rotation stopper rings 51, 52 and the holding member 76 which are fitted on the rotary sleeve 55 are integrally rotated. However, the fixed frame 47 is not rotated since the fixed frame 47 is sandwiched by the first casing 20 and the second casing 30.

Figure 3A:
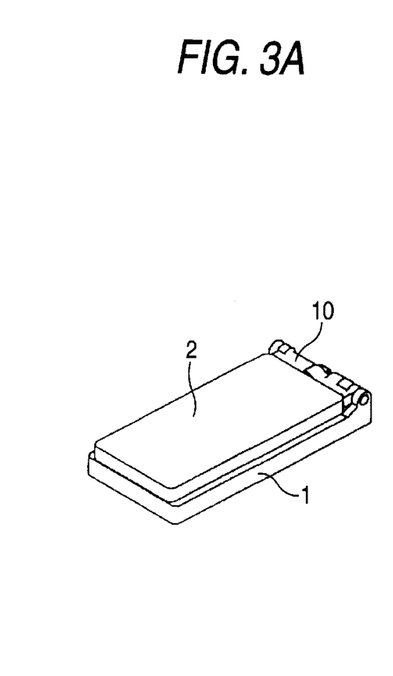
FIG. 3 is a perspective view for explaining the another manner of using the portable cellular phone of the embodiment shown in FIG. 1.
Figure 3B:
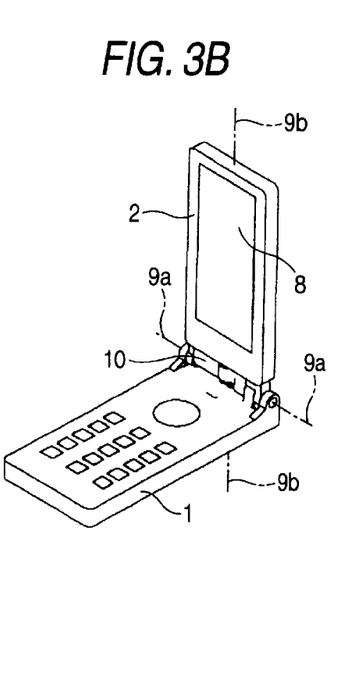
Figure 3C:
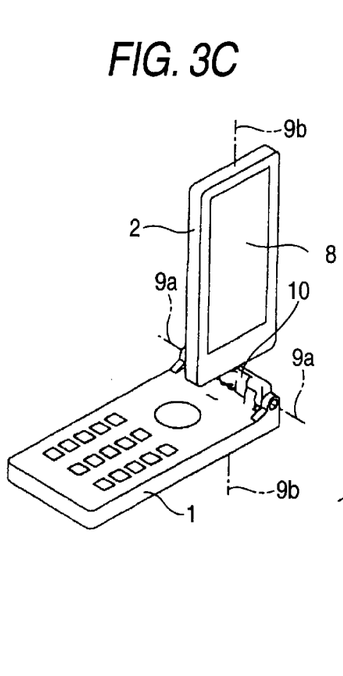
Figure 3D:
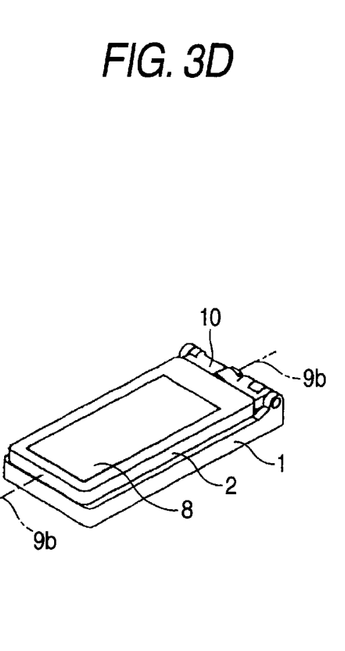

Due to the rotary movement of the rotary frame 42, the holding member 76 which is inserted into the rotary sleeve 55 is rotated, and the winding tongue 80 winds the winding portion 71 of the printed wiring film 70 or releases the winding portion 71. Even when the holding member 76 releases the printed wiring film 70, the position of the printed wiring film 70 is restricted by a pair of engaging pawls 60, 61 of the position restricting member 59 and, at the same time, is slackened about the support shaft 63 of the position restricting member 62. Accordingly, there is no possibility that the printed wiring film 70 is removed from the position restricting member 59 and the position restricting member 62 and is entangled. As a result, as shown in FIG. 3C, it is possible to hold back the display module 2 such that the liquid crystal panel 8 has a surface thereof exposed on a front surface of the display module 2.

Then, when the rotary frame 42 is rotated by a given angle, the stepped portions 53, 54 of the rotation stopper rings 51, 52 are engaged with the position restricting pawl portion 50 of the fixed frame 47. Accordingly, it is possible to prevent the excessive rotation of the rotary frame 42 thus obviating the rupture of the printed wiring film 70.

The winding portion 71 of the printed wiring film 70 may be wound around the winding tongue 80 of the holding member 76 not only one time but also a plural times. This is because that by winding the winding portions 71 a plural times, the stress concentration hardly occurs at the winding portion 71 so that it is possible to more reliably prevent the disconnection of the printed wiring. Further, the winding of the winding portion 71 a plural times gives rise to an advantage that a restoring force of the winding portion 71 which is wound around the winding tongue 80 is increased so that a smooth releasing operation can be realized.

Further, the application of the present invention is not limited to the portable cellular phone and the present invention may be applied to a digital video camera, a digital camera, a personal computer, a touch sensor, a car navigator and the like besides a portable input/output terminal device such as an electronic notebook or the like.

Accordingly to the present invention, when the rotary frame is rotated, the rotary shaft is rotated so as to neatly wind the printed wiring film. Accordingly, even when the rotary frame is rotated repeatedly, a complicated inner stress is not generated in the inside of the printed wiring film and hence, there is no possibility that the printed wiring is peeled off or disconnected. Further, by printing a large number of signal lines to the printed wiring film, it is possible to obtain an advantageous effect that a miniaturized device which can transmit a large volume of signals can be obtained.

We claim:

1. A rotary structure for relaying signals comprising:
    a fixed frame which is supported and fixed in the inside of a casing;
    a rotary shaft which is rotatably inserted into a through hole of the fixed frame and has a distal end thereof projected to the outside of the casing;
    a rotary frame which is disposed outside the casing and is fixed to the distal end of the rotary shaft such that the rotary frame is integrally rotatable with the rotary shaft; and a flexible printed wiring film which has a distal end thereof pulled out to the outside of the casing along the rotary shaft and wound around a winding tongue of the rotary shaft which is positioned in the inside of the casing.

2. A rotary structure for relaying signals according to claim 1, wherein a holding member which includes a winding tongue and constitutes a part separate from the rotary shaft is assembled to one end of the inside of the casing of the rotary shaft.

3. A rotary structure for relaying signals according to claim 1, where in on at least one side of the fixed frame, a position restricting portion which is engaged with a winding portion of the printed wiring film is mounted so as to prevent the printed wiring film from being entangled.

4. A rotary structure for relaying signals according to claim 1, wherein rotation restricting means which restricts a rotational movement of the rotary frame is mounted on the fixed frame.

5. A rotary structure for relaying signals according to claim 1, wherein a resilient ring which ensures a so-called click feeling is arranged between the fixed frame and the rotary frame.

6. A rotary structure for relaying signals according to claim 1, wherein on at least one end of a straight winding portion of the printed wiring film, an extension portion which extends in the direction orthogonal to an axis of the winding portion is formed.

7. A rotary structure for relaying signals according to claim 1, wherein on one end of a straight winding portion of the printed wiring film, a first extension portion which extends in the direction orthogonal to an axis of the winding portion is formed, and on the other end of the winding portion, a second extension portion which is arranged orthogonal to an axis of the winding portion and extends in the direction opposite to the first extension portion is formed.

8. A rotary structure for relaying signals according to claim 7, wherein the second extension portion of the printed wiring film has a bent planar shape.

* * * * *